US012785644B2

(12) United States Patent
Ohmae

(10) Patent No.: US 12,785,644 B2
(45) Date of Patent: Nov. 3, 2026

(54) FILTER CIRCUIT

(71) Applicant: Murata Manufacturing Co., Ltd., Kyoto (JP)

(72) Inventor: Yuki Ohmae, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 79 days.

(21) Appl. No.: 18/973,632

(22) Filed: Dec. 9, 2024

(65) Prior Publication Data

US 2025/0192746 A1 Jun. 12, 2025

(30) Foreign Application Priority Data

Dec. 12, 2023 (JP) ................................ 2023-209450

(51) Int. Cl.

*H03H 7/01* (2006.01)
*H01F 27/28* (2006.01)
*H01G 4/30* (2006.01)

(52) U.S. Cl.

CPC ....... *H03H 7/0115* (2013.01); *H01F 27/2804* (2013.01); *H01G 4/30* (2013.01)

(58) Field of Classification Search

CPC ..... H03H 7/0115; H01F 27/2804; H01G 4/30
See application file for complete search history.

(56) References Cited

U.S. PATENT DOCUMENTS

| | | | | |
|---|---|---|---|---|
| 9,306,529 | B2 * | 4/2016 | Imamura | H03H 7/1775 |
| 9,419,579 | B2 * | 8/2016 | Mizoguchi | H03H 7/0115 |
| 11,811,382 | B2 * | 11/2023 | Motoyama | H03H 7/1766 |
| 12,244,285 | B2 * | 3/2025 | Motoyama | H03H 7/463 |
| 12,512,815 | B2 * | 12/2025 | Ogawa | H03H 7/0115 |
| 12,647,087 | B2 * | 6/2026 | Toumori | H03H 7/0115 |
| 2025/0293656 | A1 * | 9/2025 | Ohmae | H03H 7/1766 |

FOREIGN PATENT DOCUMENTS

| | | | |
|---|---|---|---|
| JP | H09-8427 | A | 1/1997 |
| JP | 2002-171103 | A | 6/2002 |
| JP | 2006-262349 | A | 9/2006 |
| JP | 2009-200108 | A | 9/2009 |

* cited by examiner

*Primary Examiner* — Andrea Lindgren Baltzell
*Assistant Examiner* — Alan Wong
(74) *Attorney, Agent, or Firm* — McDonald Hopkins LLC

(57) ABSTRACT

A filter circuit includes an LC circuit having one end connected to a signal path connecting an input terminal and an output terminal and the other end connected to a reference potential. A filter circuit according to a first embodiment includes a substrate and a plurality of electrodes provided on a main surface of the substrate or inside the substrate. The LC circuit includes a first capacitor, a first inductor connected in parallel, and a second capacitor connected in series. The electrodes overlap with each other at least partially when viewed in a thickness direction of the substrate. Portions of the electrodes overlapping with each other are electrodes of the first capacitor or the second capacitor.

13 Claims, 16 Drawing Sheets

FILTER CIRCUIT

CROSS REFERENCE TO RELATED APPLICATION

This application claims priority from Japanese Patent Application No. 2023-209450 filed on Dec. 12, 2023. The content of this application is incorporated herein by reference in its entirety.

BACKGROUND ART

The present disclosure relates to a filter circuit.

Japanese Unexamined Patent Application Publication No. 2006-262349 describes a resonance circuit that attenuates a specific frequency.

BRIEF SUMMARY

However, in the resonance device described in Japanese Unexamined Patent Application Publication No. 2006-262349, it is suitable to increase the size of electrodes to ensure the capacitance of capacitors.

The present disclosure provides a smaller filter circuit.

A filter circuit according to an aspect of the present disclosure is a filter circuit including an LC circuit having one end connected to a signal path connecting an input terminal and an output terminal and the other end connected to a reference potential. The filter circuit includes a substrate, a first electrode provided on one main surface of the substrate, a second electrode provided inside the substrate, and a third electrode provided on the other main surface of the substrate. The LC circuit includes a first capacitor having one electrode connected to the signal path, a first inductor having one electrode connected to the signal path, and a second capacitor having one electrode connected to the first capacitor and the first inductor and the other electrode connected to the reference potential. The first electrode and the second electrode overlap with each other at least partially when viewed in a thickness direction of the substrate. The second electrode and the third electrode overlap with each other at least partially when viewed in the thickness direction of the substrate. A portion of the first electrode overlapping with the second electrode is the one electrode of the first capacitor. A portion of the second electrode overlapping with the first electrode is the other electrode of the first capacitor. A portion of the second electrode overlapping with the third electrode is the one electrode of the second capacitor. A portion of the third electrode overlapping with the second electrode is the other electrode of the second capacitor.

According to the present disclosure, it is possible to provide a smaller filter circuit.

DETAILED DESCRIPTION

Embodiments of the present disclosure will be described below. The present disclosure is not limited by the embodiments. Each of the embodiments is exemplary, and it goes without necessarily saying that partial substitution or combination of the configurations shown in the different embodiments is possible.

First Embodiment

Figure 1:
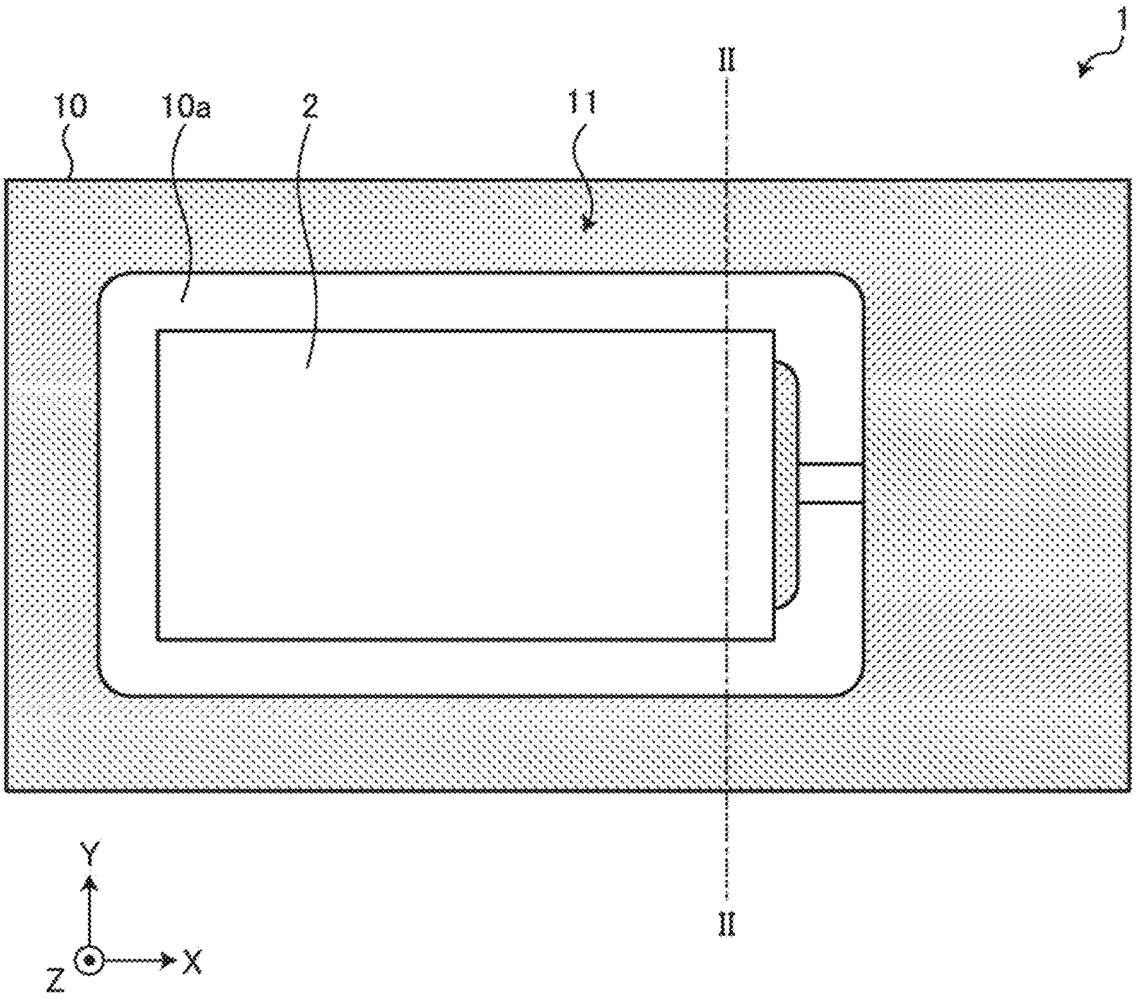
FIG. 1 is a schematic view illustrating a module to which a filter circuit according to a first embodiment is applied.
Figure 2:
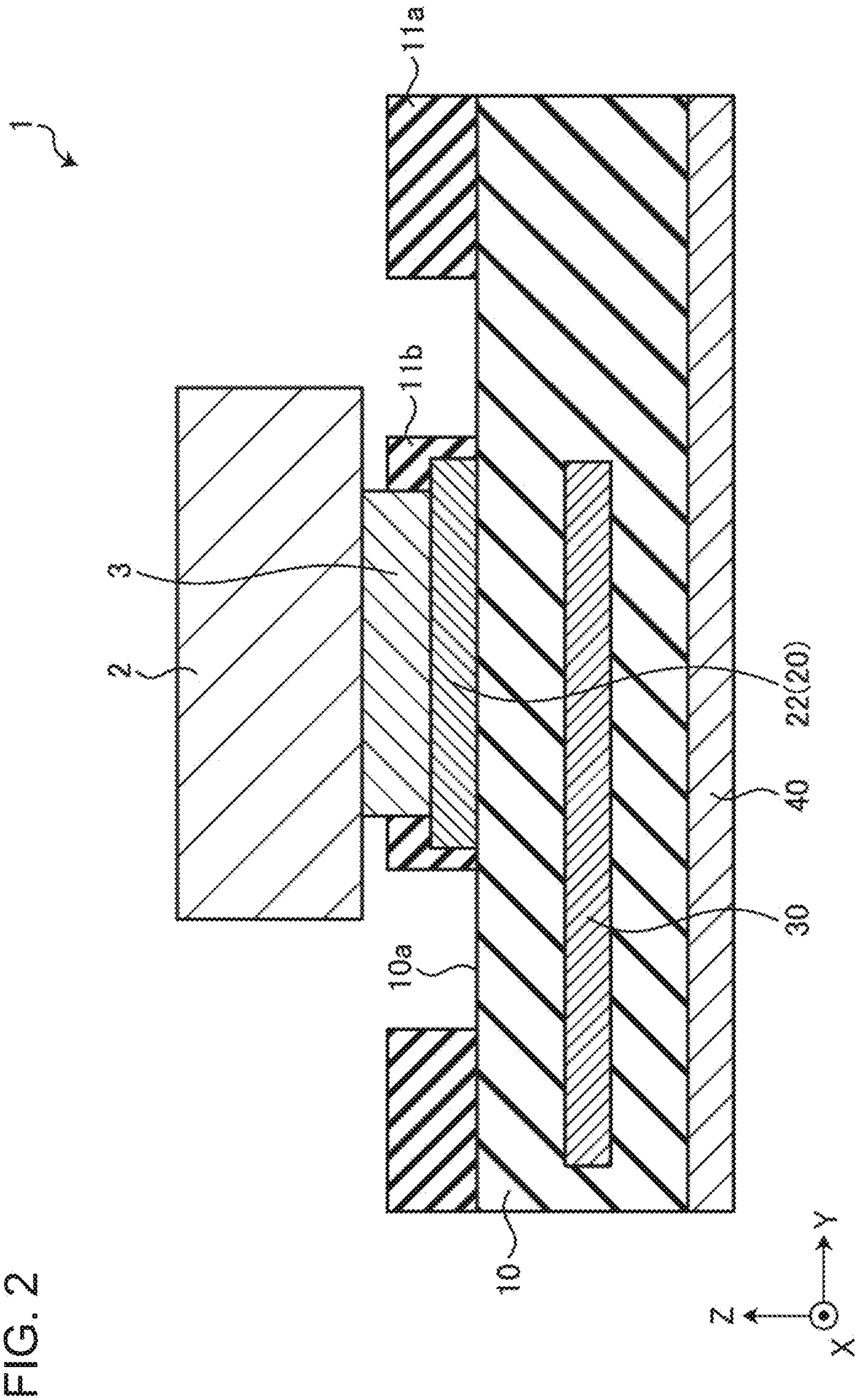
FIG. 2 is a sectional view taken along line II-II of FIG. 1.

FIG. 1 is a schematic view illustrating a module to which a filter circuit according to a first embodiment is applied. FIG. 2 is a sectional view taken along line II-II according to the first embodiment. A module 1 according to the first embodiment is an integrated module in which a plurality of integrated circuits and various functional components mounted on a substrate 10 are integrated.

In the module 1, an element 2 is provided on a main surface of the substrate 10. The element 2 is, for example, a surface mount device (SMD). A filter circuit F1 according to the first embodiment is applied to the module 1 and is connected to the element 2. The connection between the filter circuit F1 and the element 2 will be described later.

Figure 3:
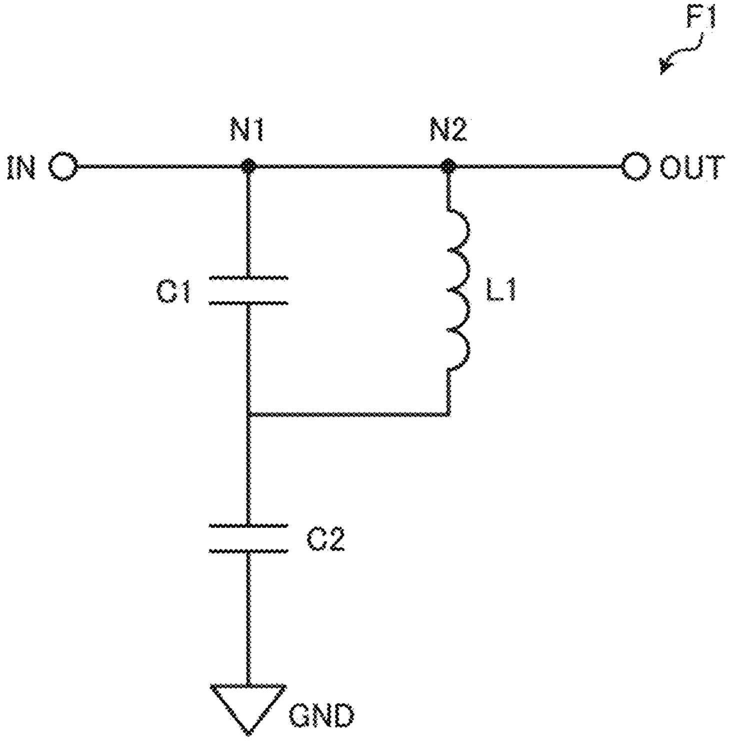
FIG. 3 is a circuit diagram illustrating the filter circuit according to the first embodiment.

FIG. 3 is a circuit diagram illustrating the filter circuit according to the first embodiment. As illustrated in FIG. 3, the filter circuit F1 according to the first embodiment is a notch filter in which an LC circuit is connected. One end of the LC circuit is connected to a signal path connecting an input terminal IN and an output terminal OUT, and the other end of the LC circuit is connected to a ground GND. The LC circuit includes a first capacitor C1, a first inductor L1, and a second capacitor C2. One electrode of the first capacitor C1 is connected to a node N1 on the signal path, and the other electrode of the first capacitor C1 is connected to one electrode of the second capacitor C2. One end of the first inductor L1 is connected to a node N2 on the signal path, and the other end of the first inductor L1 is connected to the one electrode of the second capacitor C2. That is, the first inductor L1 is connected in parallel with the first capacitor.

The one electrode of the second capacitor C2 is connected to the other electrode of the first capacitor C1 and the other end of the first inductor L1, and the other electrode of the second capacitor C2 is connected to the ground GND. That is, the second capacitor C2 is connected in series with the first capacitor C1 and the first inductor L1. Thus, the signal can be attenuated at a desired attenuation pole by a parallel resonance circuit, by appropriately adjusting the sum of the electrostatic capacitances of the first capacitor C1 and the second capacitor C2 and the inductance of the first inductor L1.

Here, the electrostatic capacitance of the first capacitor C1 is 0.03 pF or more. Thus, since the electrostatic capacitance of the first capacitor C1 contributes to the resonance characteristics, the signal can be attenuated at a desired attenuation pole.

Here, the capacitance of the first capacitor C1 and the capacitance of the second capacitor C2 can be the same. In the filter circuit F1 of FIG. 3, the larger the sum of the capacitance of the first capacitor C1 and the capacitance of the second capacitor C2, the more the frequency of the attenuation pole can be reduced. On the other hand, even if the capacitance of the first capacitor C1 and the capacitance of the second capacitor are different, the frequency of the attenuation pole does not change when the sum of the capacitances is the same. Therefore, by making the capacitance of the first capacitor C1 and the capacitance of the second capacitor C2 equal, the frequency of the attenuation pole can be reduced while suppressing the increase in the areas of the electrodes of the first capacitor C1 or the second capacitor C2.

As illustrated in FIG. 2, the filter circuit F1 according to the first embodiment includes the substrate 10, a protective film 11, a first pattern 20, a second pattern 30, and a third electrode 40.

Examples of the substrate 10 include a ceramic laminated substrate, such as a Low Temperature Co-fired Ceramics (LTCC) substrate, a resin multilayer substrate, a film substrate, and the like. The base material of the substrate 10 is a dielectric. The substrate 10 has a main surface 10*a*. In the following description, the thickness direction of the substrate 10 is defined as a Z direction, a direction perpendicular to the Z direction is defined as an X direction, and the direction perpendicular to the Z direction and the X direction is defined as a Y direction.

Figure 4:
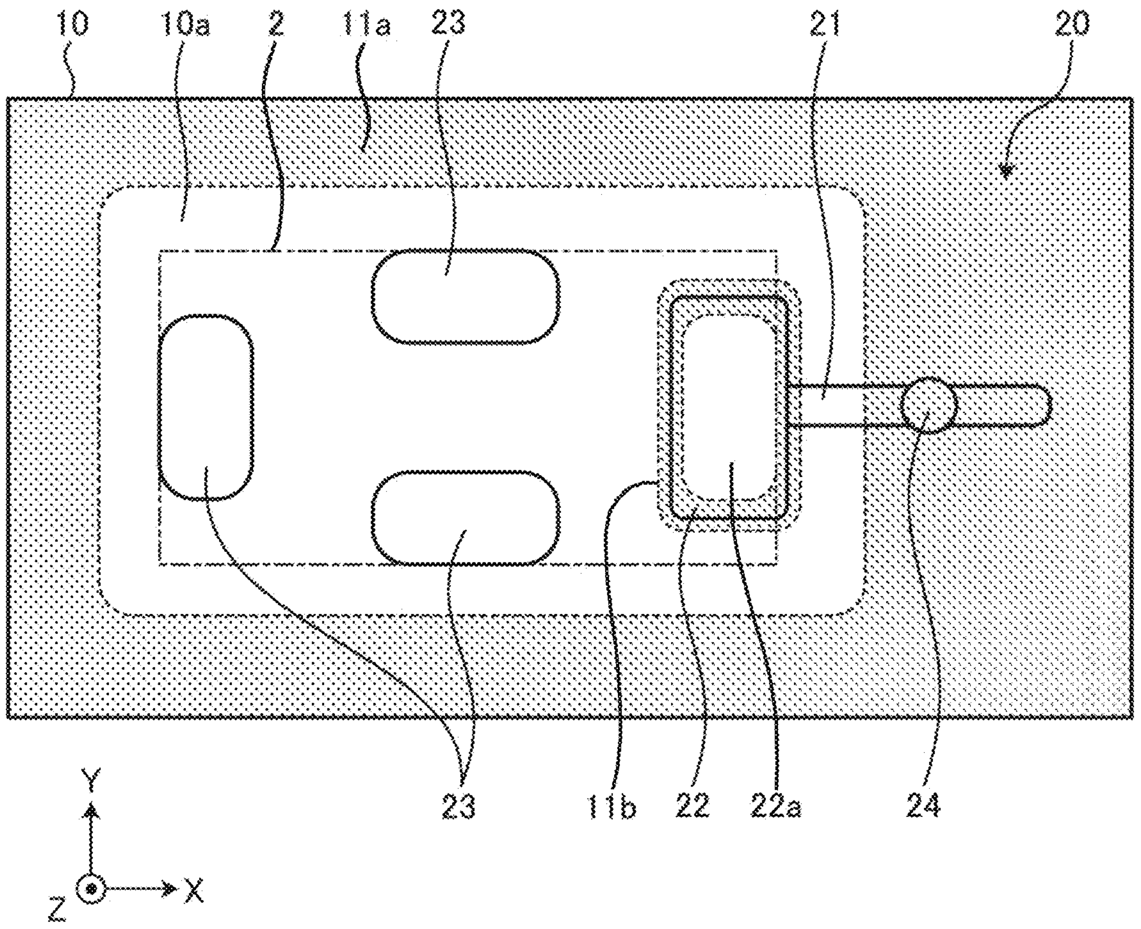
FIG. 4 is a schematic view illustrating a main surface of a substrate of the filter circuit according to the first embodiment.

FIG. 4 is a schematic view illustrating a main surface of the substrate of the filter circuit according to the first embodiment. The first pattern 20 is a conductor pattern provided on the main surface 10*a* of the substrate 10. The first pattern 20 according to the first embodiment has a main line 21, a first electrode 22, fourth electrodes 23, and a conductive via 24.

The main line 21 is a signal path of the filter circuit F1. That is, the main line 21 is at least a portion of a line connecting the input terminal and the output terminal of the filter circuit F1. In the example of FIG. 4, the main line 21 extends in the X direction, and the main line 21 is connected to the output terminal (not shown) on one side in the X direction and connected to the first electrode 22, which corresponds to the input terminal, on the other side in the X direction.

The first electrode 22 corresponds to the one electrode of the first capacitor C1. That is, the first electrode 22 is connected to the main line 21. Here, the first electrode 22 is an electrode whose minimum length in plan view in the Z direction is larger than the width of the main line 21. The width of the main line 21 means an average of the lengths of the main line 21 in the direction perpendicular to the extending direction thereof. In the example of FIG. 4, the width of the main line 21 refers to the length of the main line 21 in the Y direction. The minimum length of the first electrode 22 means the minimum distance between two different points on the edge of the first electrode 22. In the example of FIG. 4, the minimum length of the first electrode 22 refers to the length of the first electrode 22 in the X direction. In the example of FIG. 4, the first electrode 22 is connected to the main line 21 on one side in the X direction, but the configuration of the first electrode 22 illustrated in FIG. 4 is exemplary, and the first electrode 22 is not limited thereto as long as the first electrode 22 is connected to the main line 21. The shape of the first electrode is rectangular; however, the shape of the first electrode is not limited thereto, and the first electrode may have other shapes such as a circular shape.

The fourth electrodes 23 are connection terminals to the element 2. The fourth electrodes 23 are provided apart from the first electrode 22. In the example of FIG. 4, three fourth electrodes 23 are provided apart from the first electrode 22 in the X direction and are disposed so that both ends of the element 2 in the X direction and both ends of the element 2 in the Y direction overlap with the first electrode 22 or the fourth electrodes 23.

The conductive via 24 is a via that connects the main line 21 and a transmission line 31, which is to be described later. The conductive via 24 connects the main line 21 to one end of the transmission line 31 in the Z direction. In the example of FIG. 4, the conductive via 24 is provided on the main line 21, but this is only one example.

Figure 5:
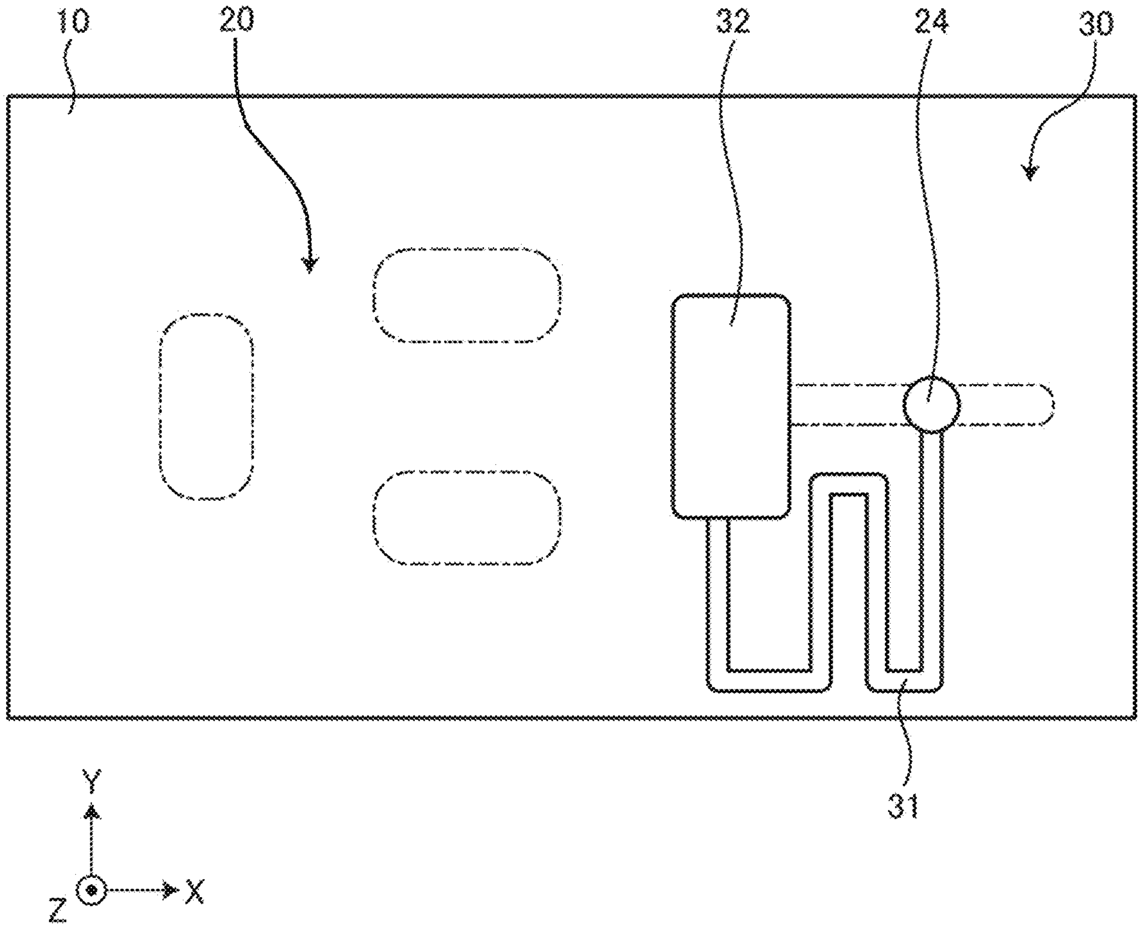
FIG. 5 is a schematic view illustrating the inside of the substrate of the filter circuit according to the first embodiment.

FIG. 5 is a schematic view illustrating the inside of the substrate of the filter circuit according to the first embodiment. The second pattern 30 is a conductor pattern provided inside the substrate 10. The second pattern 30 according to the first embodiment has the transmission line 31 and a second electrode 32.

The transmission line 31 is a transmission line that connects the main line 21 and the second electrode 32. Here, the transmission line means a conductor layer having a shape extending linearly in plan view in the Z direction. In the example of FIG. 4, transmission line 31 has one end thereof connected to the conductive via 24, and the other end thereof connected to the second electrode 32.

In the first embodiment, the transmission line 31 corresponds to the first inductor L1. In the example of FIG. 5, the transmission line 31 has a meander shape. Here, the meander shape means a shape that extends in one direction while extending and meandering alternately in one orientation and the other orientation in a direction intersecting the one direction. In the example of FIG. 5, the transmission line 31 extends in the X direction while extending and meandering alternately in one orientation and the other orientation in the Y direction. Thus, sufficient inductance can be generated by the transmission line 31.

The second electrode 32 corresponds to the other electrode of the first capacitor C1 and the one electrode of the second capacitor C2. Here, the second electrode 32 is an electrode whose minimum length in plan view in the Z direction is larger than the width of the main line 21. The minimum length of the second electrode 32 means the minimum distance between two different points on the edge of the second electrode 32. In the example of FIG. 5, the minimum length of the second electrode 32 refers to the length of the second electrode 32 in the X direction. The second electrode 32 overlaps with the first electrode 22 and the third electrode 40 when viewed in the Z direction. Since the base material of the substrate 10 is a dielectric, the second electrode 32 can generate an electrostatic capacitance as the first capacitor C1 between the second electrode 32 and the first electrode 22. Also, the second electrode 32 can generate an electrostatic capacitance as the second capacitor C2 between the second electrode 32 and the third electrode 40. The shape of the second electrode 32 is rectangular; however, the shape of the second electrode 32 is not limited thereto, and the second electrode 32 may have other shapes such as a circular shape.

In the first embodiment, the minimum distance in a width direction between the edge of the transmission line 31 in the width direction and the edge of the second electrode 32 is 20 μm or more. Here, the width direction of the transmission line 31 refers to a direction perpendicular to the extending direction of the transmission line 31, and the edge of the transmission line 31 in the width direction refers to an edge of the transmission line 31 in the width direction and extending in the extending direction of the transmission line 31. Thus, since the transmission line 31 and the second electrode 32 are sufficiently separated from each other, it is possible to suppress the occurrence of parasitic components between the transmission line 31 and the second electrode 32.

The third electrode 40 corresponds to the other electrode of the second capacitor C2. That is, the third electrode 40 is connected to the ground GND. Here, the third electrode 40 is an electrode whose minimum length in plan view in the Z direction is larger than the width of the main line 21. The minimum length of the third electrode 40 means the minimum distance between two different points on the edge of the third electrode 40. The third electrode 40 is provided on the other main surface of the substrate 10, that is, on the main surface opposite to the main surface 10*a*. The third electrode 40 is a conductor film provided to cover the other main surface of the substrate 10; however, such configuration of the third electrode 40 is merely one example, and the third electrode 40 may be a conductor film provided on a portion of the main surface opposite to the main surface 10*a*.

In the module 1 according to the first embodiment, the connection between the filter circuit F1 and the element 2 and the protective film 11 will be described in detail below.

As illustrated in FIG. 2, the element 2 is connected to the first electrode 22 via a conductive bonding material 3 such as solder paste containing a low-melting-point metal. The element 2 is connected to the fourth electrodes 23 via the conductive bonding material 3. The low-melting-point metal is called a solder which is, for example, a tin alloy.

In FIGS. 1 and 4, a region where the protective film 11 is provided is shown by a shaded region. The protective film 11 is a film formed of an insulator and provided on the main surface 10*a*. The material of the protective film 11 is, for example, a dielectric used as a resist. In the example of FIG. 4, the protective film 11 has a protective film 11*a* provided to surround the element 2 and a protective film 11*b* provided to overlap the first electrode 22.

The protective film 11*b* is not provided in a region 22*b* of the first electrode 22. That is, in the example of FIG. 4, by not providing the protective film 11 on at least a portion of the first electrode 22, the first electrode 22 has the region 22*b* where the surface of the first electrode 22 is exposed from the protective film 11. The conductive bonding material 3 is disposed in the region 22*b*, and the element is connected to the first electrode 22 via the conductive bonding material 3 in the region 22*b*. Thus, the first electrode 22 is also used as a connection terminal to the element 2, so that the filter circuit F1 becomes smaller.

In the first embodiment, the protective film 11*b* is provided to surround the region 22*b*. Thus, the region 22*b* becomes the bottom of the recessed protective film 11*b*. Thus, when the element 2 is mounted, flowing out of the conductive bonding material 3 from the region 22*a* can be reduced, so that the element 2 can be easily mounted.

The filter circuit F1 according to the first embodiment has been described above; however, the filter according to the first embodiment is not limited to those illustrated in FIGS. 1 to 5. The substrate 10 according to the first embodiment disclosed above includes a portion having the filter circuit F1; however, the substrate 10 may include a circuit other than the filter circuit F1. Variations will be described below with reference to the drawings; however, description of the same configurations as those described above will be omitted.

First Variation

Figure 6:
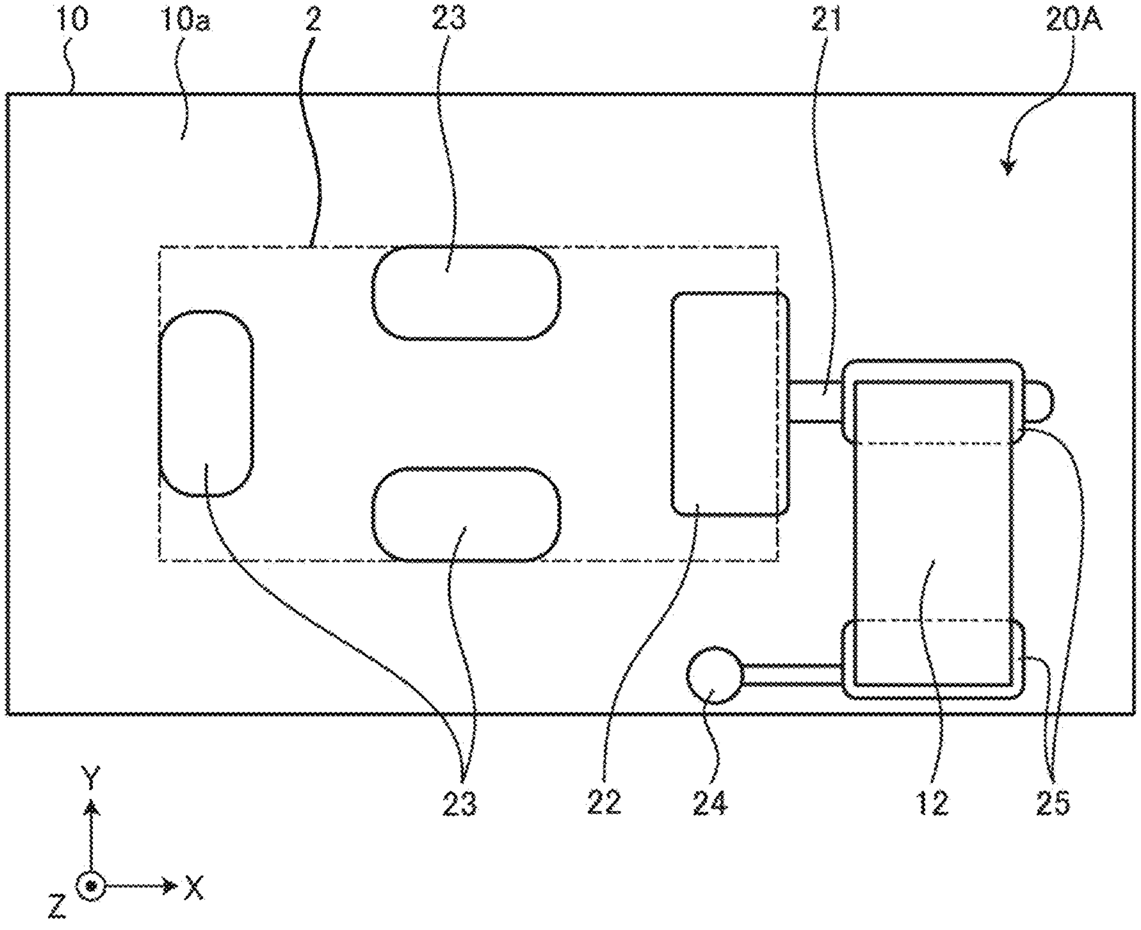
FIG. 6 is a schematic view illustrating a main surface of a substrate of a filter circuit according to a first variation.
Figure 7:
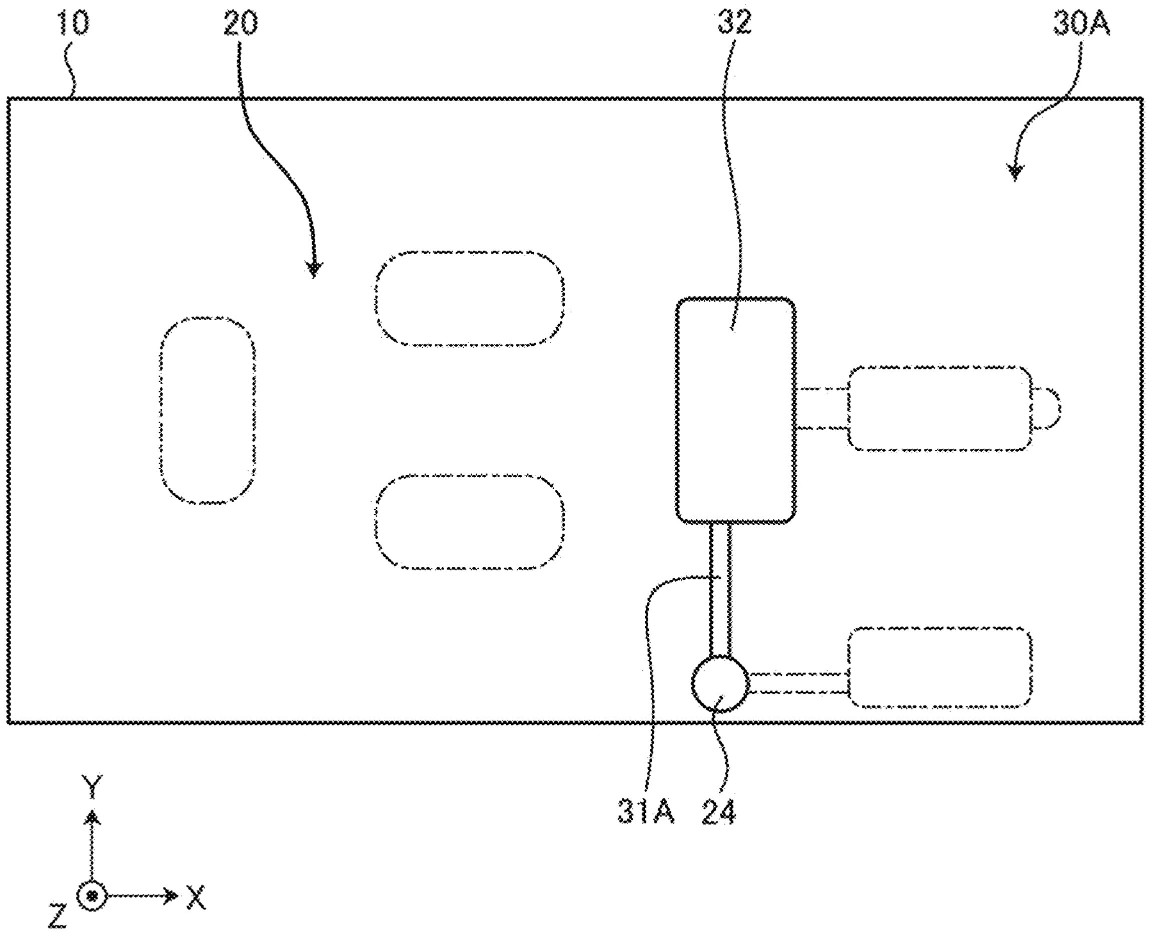
FIG. 7 is a schematic view illustrating the inside of the substrate of the filter circuit according to the first variation.

FIG. 6 is a schematic view illustrating a main surface of a substrate of a filter circuit according to a first variation. FIG. 7 is a schematic view illustrating the inside of the substrate of the filter circuit according to the first variation. As illustrated in FIG. 6, the filter circuit according to the first variation may further include an element 12, which is a surface mount element, as an inductor. The element 12 is provided on a main surface 10*a* of a substrate 10. In FIG. 6, a protective film is the same as the protective film 11 illustrated in FIG. 4 except that no protective film is provided in the region of electrodes 25 to be connected to the element 12.

As illustrated in FIG. 6, a first pattern 20A according to the first variation further includes the electrodes 25. In the example of FIG. 6, one of the electrodes 25 is provided on a main line 21, and the other of the electrodes 25 is connected to a conductive via 24. Thus, both ends of the element 12 can be connected to the pair of electrodes 25 provided in the first pattern 20A. As illustrated in FIG. 7, a transmission line 31A according to the first variation is linear and connects a second electrode 32 and the conductive via 24.

Second Variation

Figure 8:
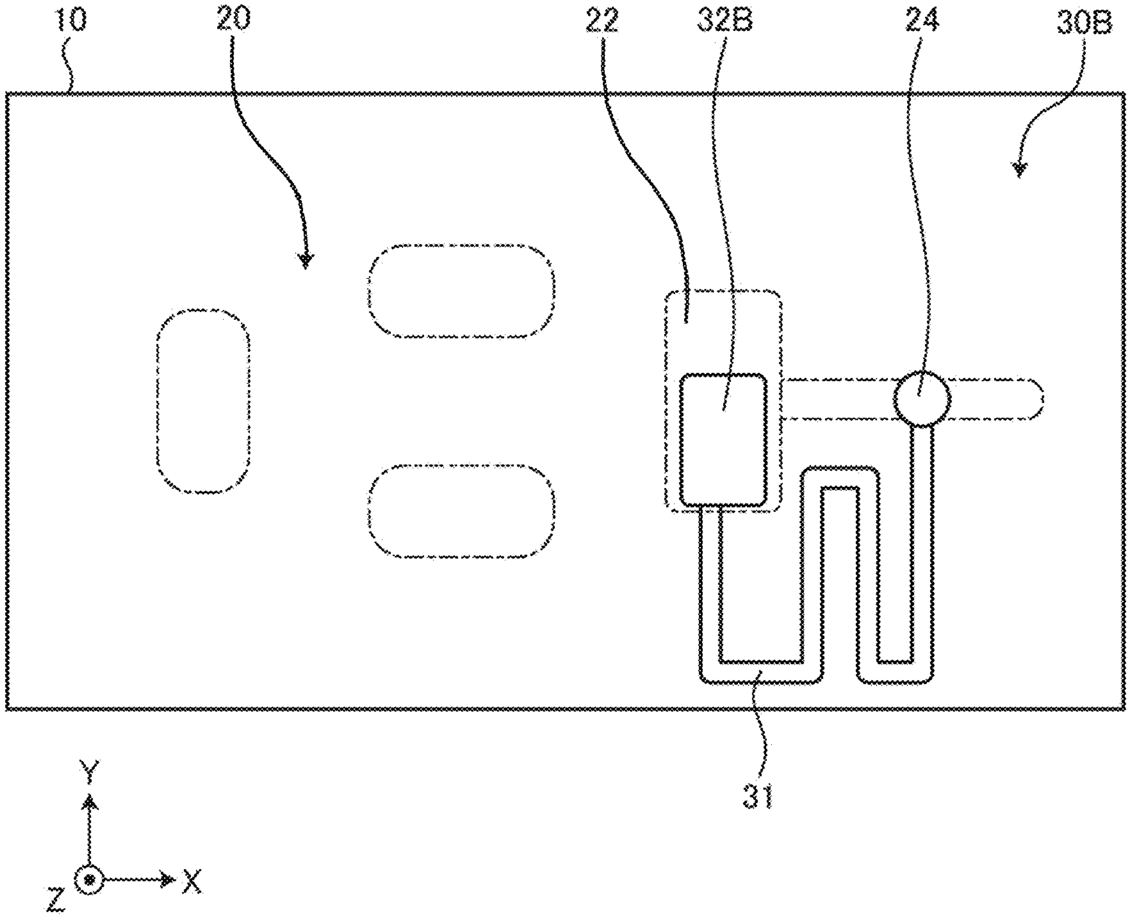
FIG. 8 is a schematic view illustrating the inside of a substrate of a filter circuit according to a second variation.

FIG. 8 is a schematic view illustrating the inside of a substrate of a filter circuit according to a second variation. As illustrated in FIG. 8, in the filter circuit according to the second variation, a second electrode 32B partially overlaps with a first electrode 22 in plan view in the Z direction. Note that a first pattern 20 and a protective film according to the second variation are the same as the protective film 11 illustrated in FIG. 4. In such a case, the region of the first electrode 22 overlapping the second electrode 32B in plan view in the Z direction corresponds to the one electrode of the first capacitor C1. Further, a capacitor can be formed in which one electrode thereof is the first electrode 22 and the other electrode thereof is the third electrode 40.

Third Variation

Figure 9:
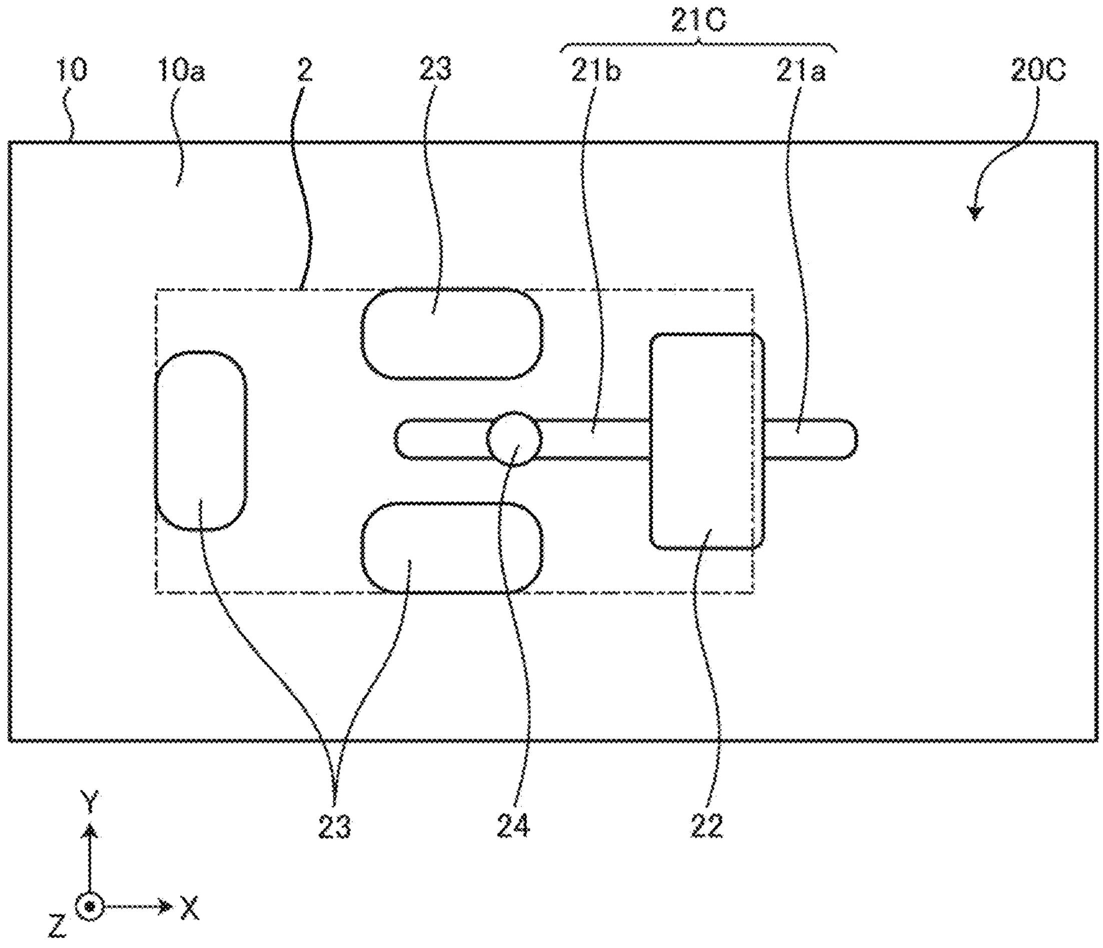
FIG. 9 is a schematic view illustrating a main surface of a substrate of a filter circuit according to a third variation.
Figure 10:
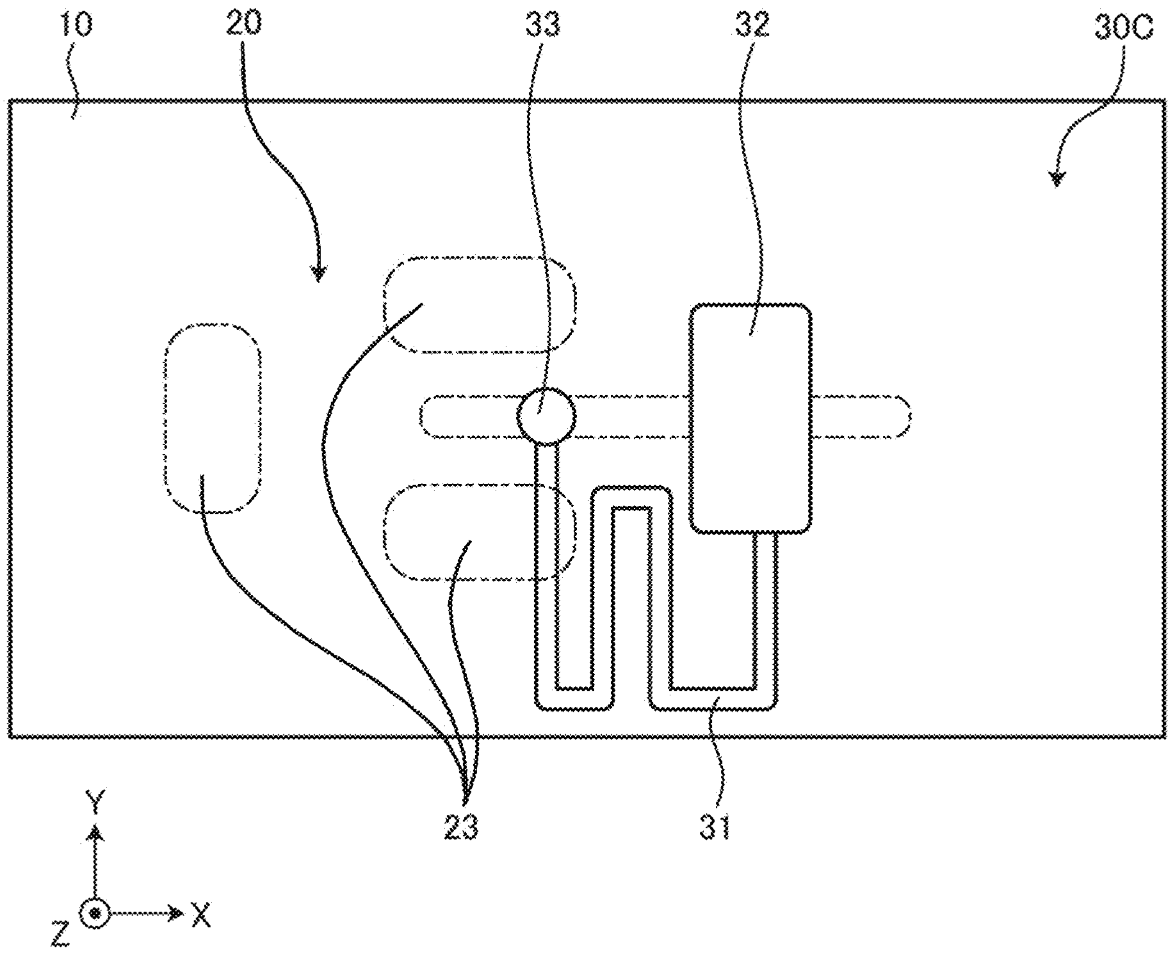
FIG. 10 is a schematic view illustrating the inside of the substrate of the filter circuit according to the third variation.

FIG. 9 is a schematic view illustrating a main surface of a substrate of a filter circuit according to a third variation. FIG. 10 is a schematic view illustrating the inside of the substrate of the filter circuit according to the third variation. As illustrated in FIGS. 9 and 10, in the filter circuit according to the third variation, a portion of a main line 21 and a conductive via 24 are provided on an element 2 side in the X direction with respect to a first electrode 22, and a second pattern 30B is inverted in the X direction with a second electrode 32 as the center. Thus, in the third variation, a transmission line 31 overlaps with a fourth electrode 23 of a first pattern 20. In the example of FIG. 9, a main line 21C includes a main line 21*a* and a main line 21*b*. The main line 21*a* is provided on the side opposite to the element 2 side in the X direction with respect to the first electrode 22. The main line 21*b* is provided on the element 2 side in the X direction with respect to the first electrode 22. Here, the main line 21*b* is connected to an output terminal (not shown). Note that a protective film according to the third variation is the same as the protective film 11 illustrated in FIG. 4.

As illustrated in FIG. 10, in the third variation, the width of the portion of the transmission line 31 overlapping with the fourth electrode 23 is smaller than the minimum length of the fourth electrode 23. Here, the width of the portion of the transmission line 31 overlapping with the fourth electrode 23 is the average of the lengths of the portion of the transmission line 31 overlapping with the fourth electrode 23 in a direction perpendicular to the extending direction, in plan view in the Z direction. The minimum length of the fourth electrode 23 is the minimum distance between two different points on the edge of the fourth electrode 23. Thus, the occurrence of parasitic capacitance between the transmission line 31 and the fourth electrode 23 can be suppressed.

Note that the filter circuit according to the first embodiment is not limited to the variations described above.

For example, the third electrode is not limited to being provided on the main surface opposite to the main surface 10*a*, but may be provided inside the substrate 10 on the side opposite to the first electrode 22 with respect to the second electrode 32.

For example, the first electrode may overlap with only a portion of the second electrode. In such a case, the region of the first electrode that overlaps with the second electrode in plan view in the Z direction corresponds to one electrode of the first capacitor.

For example, the second electrode may overlap with only a portion of the third electrode. In such a case, the region of the second electrode that overlaps with the third electrode in plan view in the Z direction corresponds to one electrode of the second capacitor.

For example, the third electrode may overlap with only a portion of the second electrode. In such a case, the region of the third electrode that overlaps with the second electrode in plan view in the Z direction corresponds to the other electrode of the second capacitor.

As described above, the filter circuit F1 according to the first embodiment is a filter circuit F1 that has an LC circuit; one end of the LC circuit is connected to a signal path (main line 21) connecting an input terminal IN and an output terminal OUT, and the other end of the LC circuit is connected to a reference potential (ground GND). The filter circuit F1 according to the first embodiment includes: a substrate 10; a first electrode 22 provided on one main surface 10*a* of the substrate 10; a second electrode 32 provided inside the substrate 10; and a third electrode 40 provided on the other main surface of the substrate 10 or inside the substrate 10 on a side opposite to the first electrode 22 with respect to the second electrode 32. The LC circuit includes: a first capacitor C1 having one electrode connected to the signal path (main line 21); a first inductor L1 having one end connected to the signal path (main line 21); and a second capacitor C2 having one electrode connected to the first capacitor C1 and the first inductor L1 and the other electrode connected to the reference potential. The first electrode 22 and the second electrode 32 overlap with each other at least partially when viewed in a thickness direction of the substrate 10. The second electrode 32 and the third electrode 40 overlap with each other at least partially when viewed in the thickness direction of the substrate 10. A portion of the first electrode 22 overlapping with the second electrode 32 is the one electrode of the first capacitor C1. A portion of the second electrode 32 overlapping with the first electrode 22 is the other electrode of the first capacitor C1. A portion of the second electrode 32 overlapping with the third electrode 40 is one electrode of the second capacitor C2. A portion of the third electrode 40 overlapping with the second electrode 32 is the other electrode of the second capacitor C2.

Thus, the first capacitor C1 is formed by the second electrode 32 and the first electrode 22, and the second capacitor C2 is formed by the second electrode 32 and the third electrode 40, respectively. Therefore, as compared with a case where electrodes are formed on both main surfaces of the substrate 10 to form a capacitor, the area of the electrodes can be reduced without necessarily reducing the electric capacitance, so that a smaller filter circuit F1 can be provided.

As a desirable aspect, the electrostatic capacitance of the first capacitor C1 is 0.03 pF or more. Thus, since the electrostatic capacitance of the first capacitor C1 contributes to the resonance characteristics, the signal can be attenuated at a desired attenuation pole.

As a desirable aspect, the filter circuit F1 further includes a protective film 11 provided on a portion of the surface of the first electrode 22. The first electrode 22 at least partially has a region 22*a* where the surface of the first electrode 22 is exposed. Thus, since the first electrode 22 also serves as a connection terminal between the electrode plate of the first capacitor C1 and the element 2, a smaller module 1 can be provided.

As a desirable aspect, the filter circuit F1 further includes a fourth electrode 23, which is an electrode for mounting another element 2 and which is provided apart from the first electrode 22 on the one main surface 10*a* of the substrate 10. Thus, since the first electrode 22 also serves as a connection terminal between the electrode plate of the first capacitor C1 and the element 2, a smaller module 1 can be provided.

As a desirable aspect, the first inductor L1 is a transmission line 31 provided on the main surface of the substrate 10 or inside the substrate 10 and having one end connected to the signal path (main line 21) and the other end connected to the second electrode 32. Thus, the filter circuit F1 can be achieved with a small space, so that a smaller filter circuit F1 can be provided.

As a desirable aspect, the first inductor L1 is a transmission line 31 provided on the main surface of the substrate 10 or inside the substrate 10 and having one end connected to the signal path (main line 21) and the other end connected to the second electrode 32. A portion of the transmission line 31 overlaps with the fourth electrode 23 in the thickness direction of the substrate 10. The width of the portion of the transmission line 31 overlapping with the fourth electrode 23 is smaller than the minimum width of the fourth electrode 23. Thus, the occurrence of parasitic components between the transmission line 31 and the fourth electrode 23 can be suppressed.

As a desirable aspect, the transmission line 31 has a meander shape when viewed in the thickness direction of the substrate 10. Thus, the filter circuit F1 can be achieved with a small space, so that a smaller filter circuit F1 can be provided.

As a desirable aspect, the minimum distance in a width direction between the edge of the transmission line 31 in the width direction and the edge of the second electrode 32 is 20 μm or more. Thus, the occurrence of parasitic components between the transmission line 31 and the second electrode 32 can be suppressed.

As a desirable aspect, the first inductor L1 is an element provided on the one main surface 10*a* of the substrate 10. Even in such a case, a small-sized filter circuit F1 can be provided.

Second Embodiment

Figure 11:
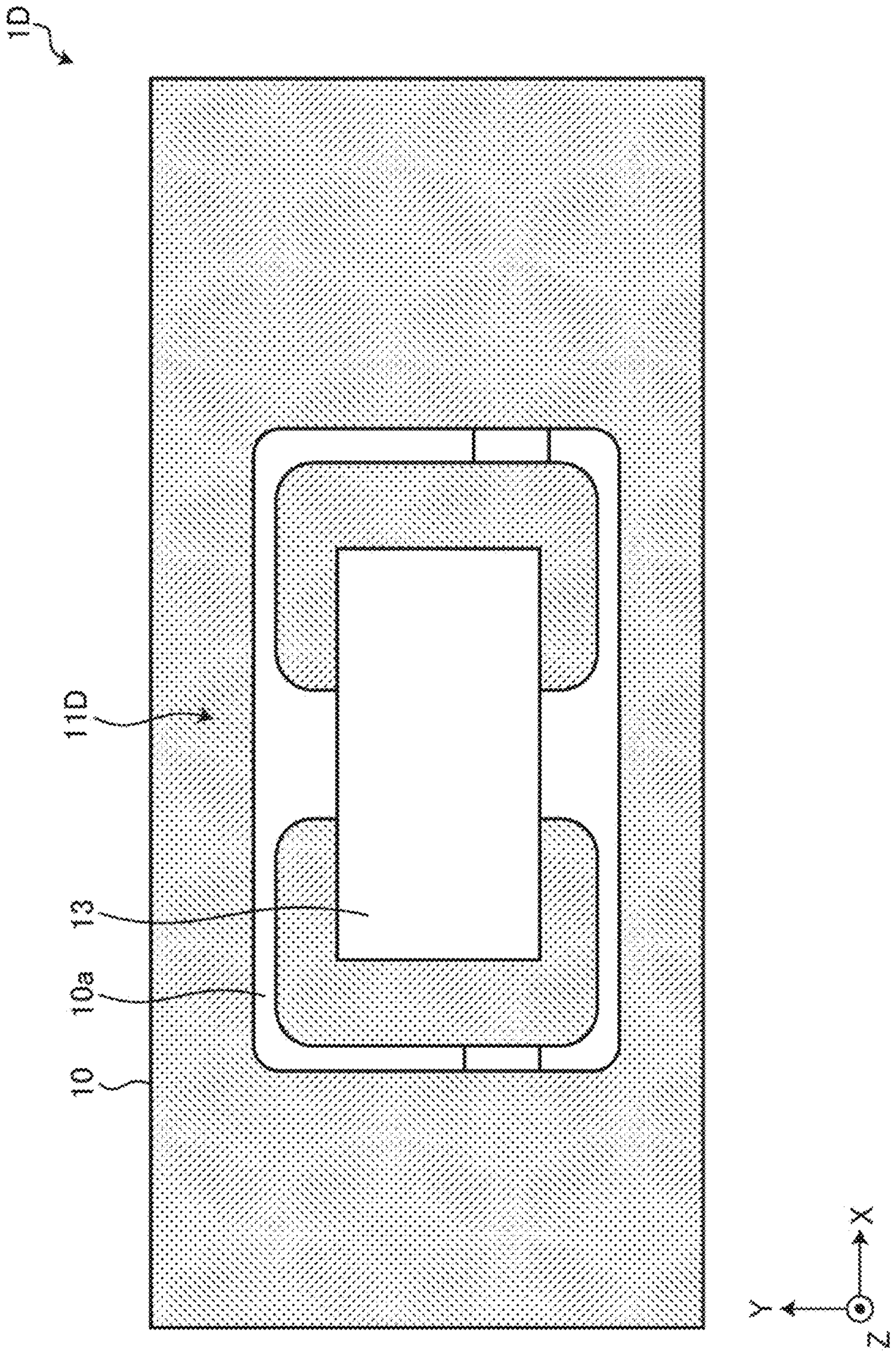
FIG. 11 is a schematic view illustrating a filter circuit according to a second embodiment.
Figure 12:
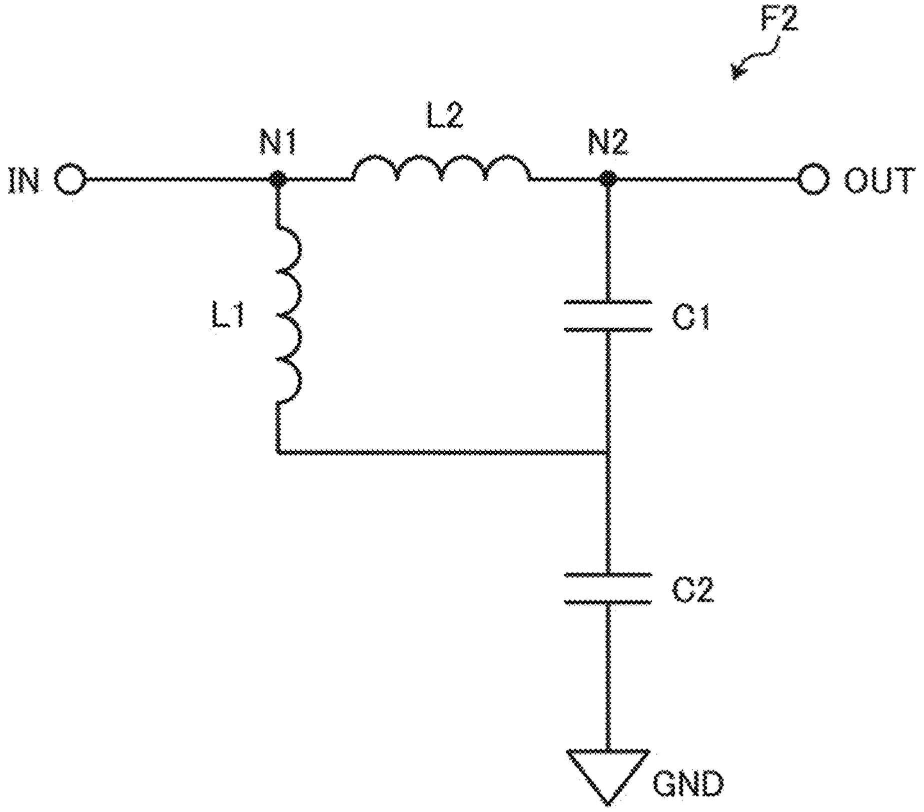
FIG. 12 is a circuit diagram illustrating the filter circuit according to the second embodiment.

FIG. 11 is a schematic view illustrating a filter circuit according to a second embodiment. As illustrated in FIG. 12, a filter circuit F2 according to the second embodiment differs from the first embodiment in that an element 13 is mounted as a second inductor on the main line. The filter circuit F2 according to the second embodiment will be described below with reference to the drawings; however, description of the same points as in the first embodiment will be omitted.

FIG. 12 is a circuit diagram illustrating the filter circuit according to the second embodiment. As illustrated in FIG. 12, the filter circuit F2 according to the second embodiment differs from the filter circuit F1 according to the first embodiment in that a second inductor L2 is inserted into the signal path connecting the input terminal IN and the output terminal OUT. One end of the second inductor L2 is connected to a node N1 on the signal path, and the other end of the second inductor L2 is connected to a node N2 on the signal path. Even in such a case, the signal can be attenuated at a desired attenuation pole by a parallel resonance circuit, by appropriately adjusting the sum of the electrostatic capacitances of a first capacitor C1 and a second capacitor C2 and the inductance of a first inductor L1. Further, by inserting the second inductor L2 into the signal path connecting the input terminal IN and the output terminal OUT, the frequency of the attenuation pole can be reduced.

Figure 13:
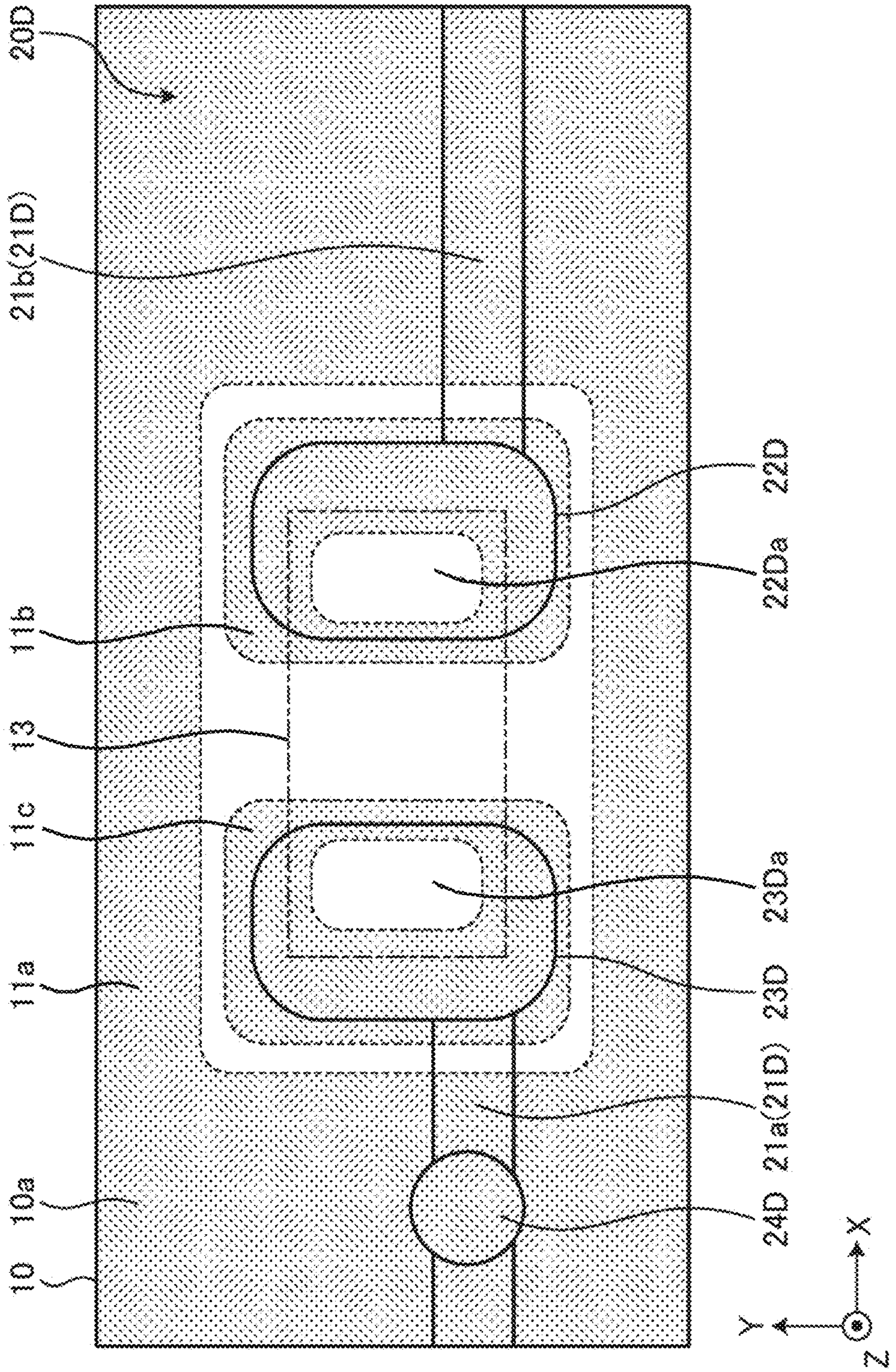
FIG. 13 is a schematic diagram illustrating a main surface of a substrate of the filter circuit according to the second embodiment.

FIG. 13 is a schematic diagram illustrating a main surface of a substrate of the filter circuit according to the second embodiment. FIG. 13 is a diagram illustrating the filter circuit according to the second embodiment, in a state where the element 13 is removed from the filter circuit. In the second embodiment, a main line 21D includes a main line 21*a* and a main line 21*b*. In the example of FIG. 13, the main line 21*a* is connected to the input terminal (not shown), and the main line 21*b* is connected to the output terminal (not shown). In the second embodiment, a first electrode 22D is connected to one end of the main line 21*b* at one end in the X direction. A fourth electrode 23D is connected to one end of the main line 21*a* at one end in the X direction. In the example of FIG. 13, a conductive via 24D is provided on the main line 21*a*, but this is merely one example.

Figure 14:
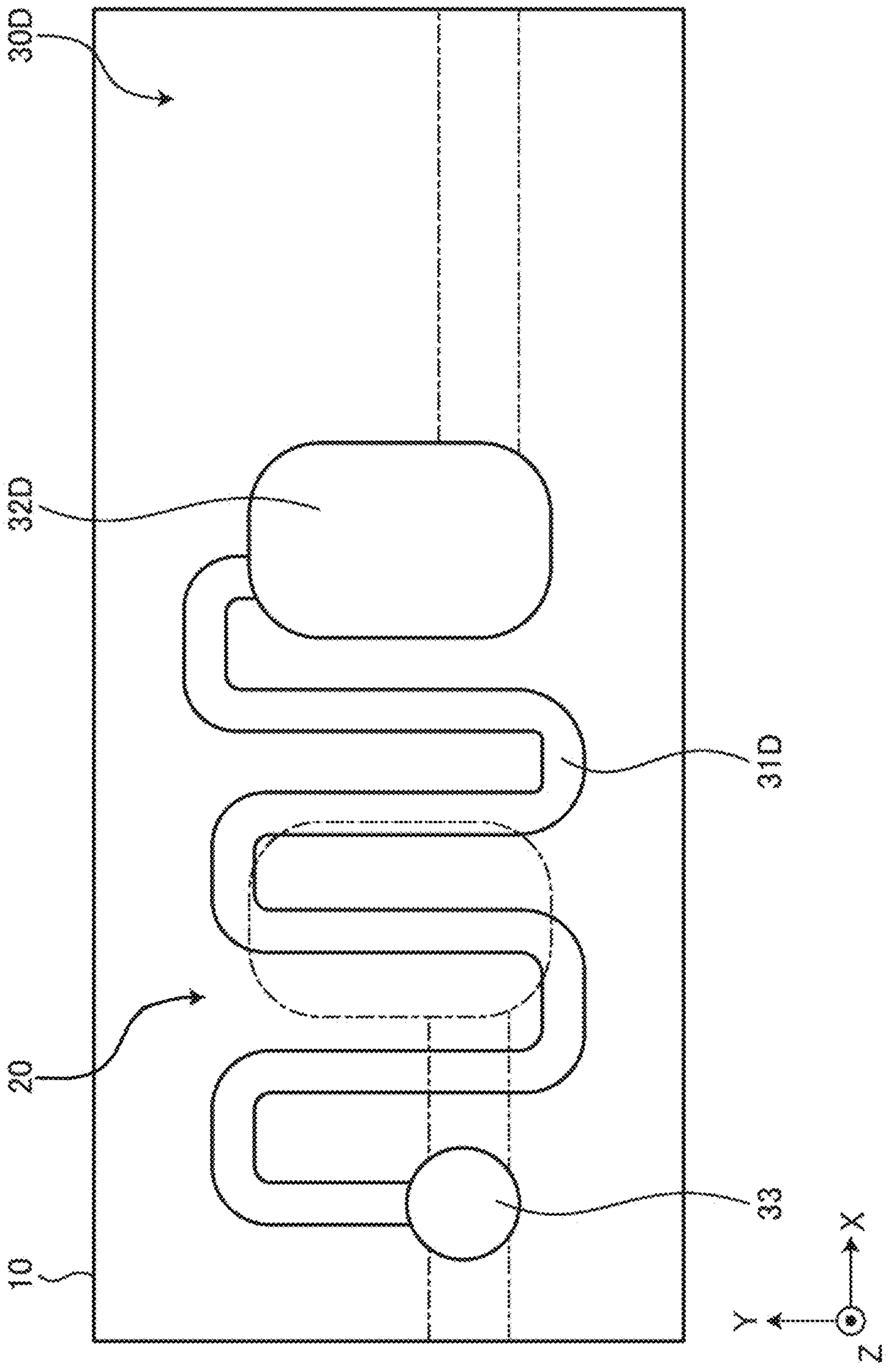
FIG. 14 is a schematic diagram illustrating the inside of the substrate of the filter circuit according to the second embodiment.

FIG. 14 is a schematic diagram illustrating the inside of the substrate of the filter circuit according to the second embodiment. In the example of FIG. 14, one end of a transmission line 31D is connected to the conductive via 24D, and the other end is connected to a second electrode 32.

In the second embodiment, as illustrated in FIG. 14, the transmission line 31D overlaps with the main line 21 and the fourth electrode 23D of a first pattern 20D. In the second embodiment, as in the third variation, the portion of the transmission line 31D overlapping with the fourth electrode 23D is smaller than the minimum length of the fourth electrode 23D. Thus, the occurrence of parasitic components between the transmission line 31D and the fourth electrode 23D can be suppressed.

The connection between the main line 21 and the element 13 and a protective film 11A in the filter circuit F2 according to the second embodiment will be described in detail below. In FIGS. 11 and 13, a region where the protective film 11 is provided is shown by a shaded region.

In the example of FIG. 13, the protective film 11 further has a protective film 11*c* provided on the fourth electrode 23D. Similarly to the protective film 11*a* for the first electrode 22D, the protective film 11*c* is provided in a frame shape to overlap the edge of the fourth electrode 23D in plan view in the Z direction. Here, the fourth electrode 23D at least partially has a region 23Da where the surface of the fourth electrode 23D is exposed from the protective film 11. In the example of FIG. 13, a conductive bonding material is disposed in the region 23Da in the same manner as a region 22Da of the first electrode 22D, and the element is connected to the fourth electrode 23D via the conductive bonding material.

In the second embodiment, the region 22Da is located on the fourth electrode side of the first electrode 22D in plan view in the Z direction. More specifically, the fourth electrode 23D is located in the direction of the geometric center of the region 22Da with respect to the geometric center of the first electrode 22D in plan view in the Z direction. Thus, the area of the region where the element 13 and the first electrode 22D overlap with each other can be reduced in plan view in the Z direction, so that the occurrence of parasitic components between the element 13 and the first electrode 22D can be suppressed.

In the second embodiment, similarly to the region 22Da, the region 23Da is located on the fourth electrode side of the fourth electrode 23D in plan view in the Z direction. More specifically, the first electrode 22D is located in the direction of the geometric center of the region 23Da with respect to the geometric center of the fourth electrode 23D in plan view in the Z direction. Thus, the area of the region where the element 13 and the fourth electrode 23D overlap with each other can be reduced in plan view in the Z direction, so that the occurrence of parasitic components between the element 13 and the fourth electrode 23D can be suppressed.

The filter circuit F2 according to the second embodiment has been described above; however, the filter according to the second embodiment is not limited to those illustrated in FIGS. 11 to 14. Variations will be described below with reference to the drawings.

Fourth Variation

Figure 15:
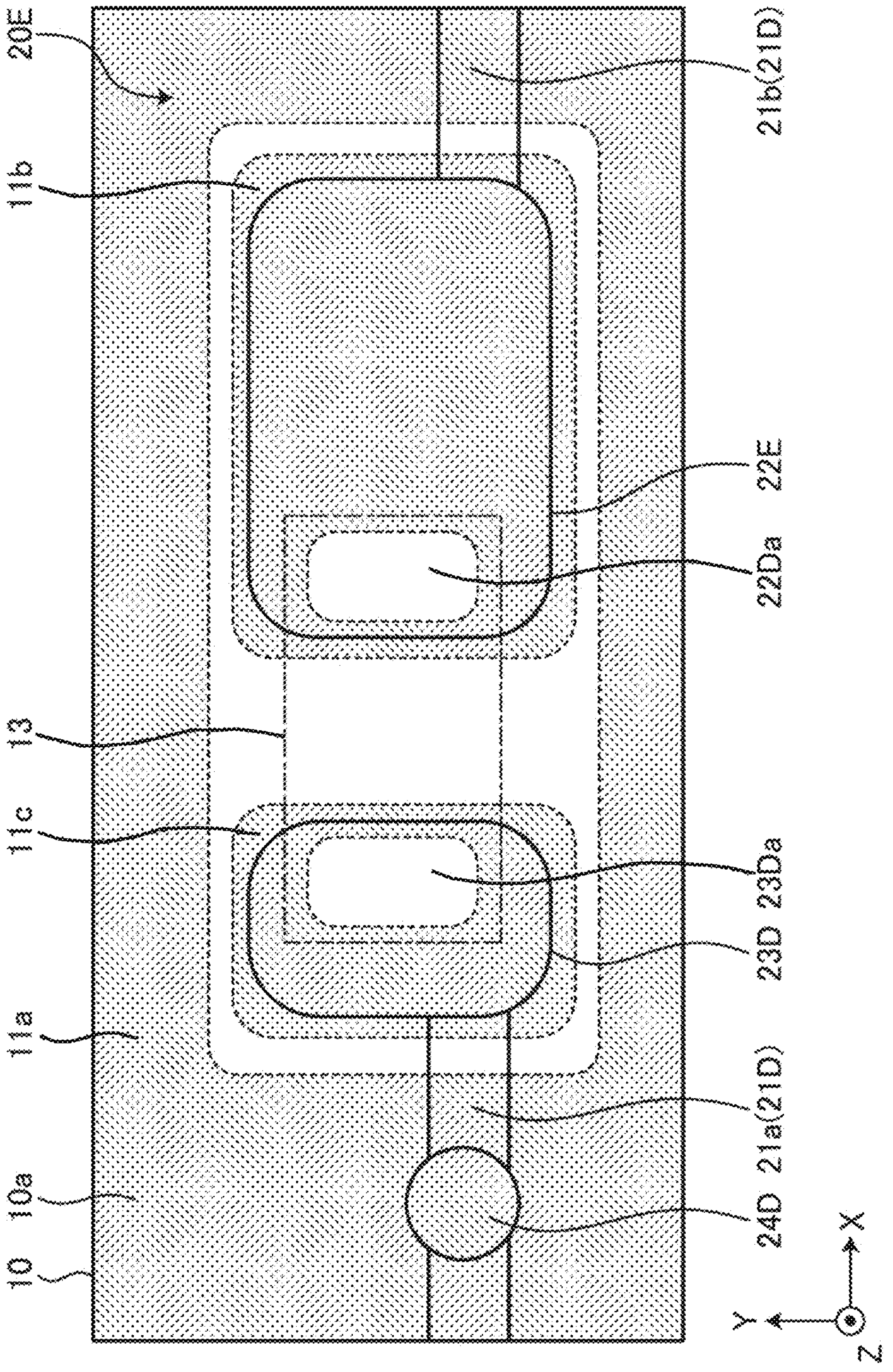
FIG. 15 is a schematic diagram illustrating a main surface of a substrate of a filter circuit according to a fourth variation.
Figure 16:
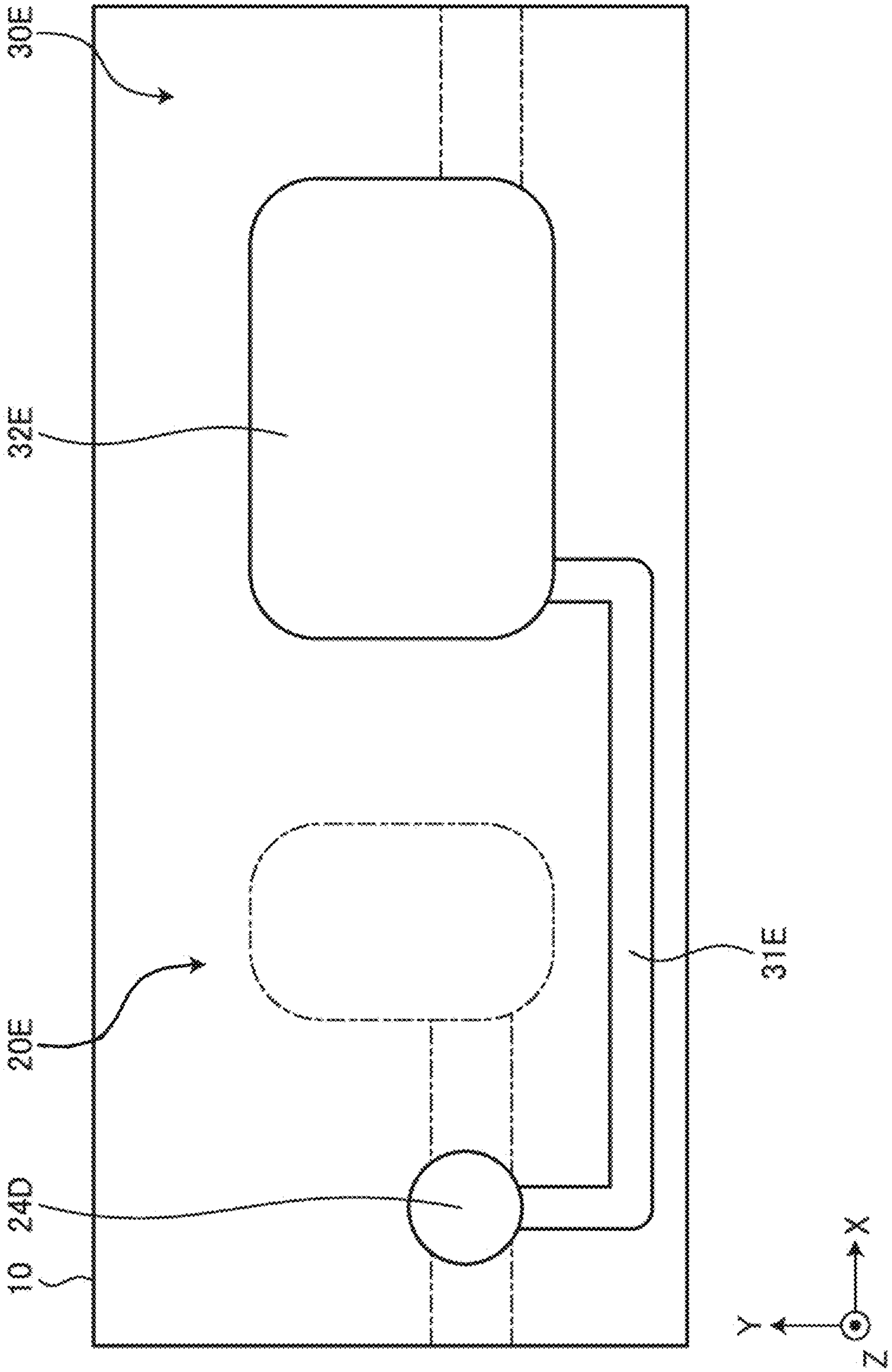
FIG. 16 is a schematic diagram illustrating the inside of the substrate of the filter circuit according to the fourth variation.

FIG. 15 is a schematic diagram illustrating a main surface of a substrate of a filter circuit according to a fourth variation. FIG. 16 is a schematic diagram illustrating the inside of the substrate of the filter circuit according to the fourth variation. As illustrated in FIG. 15, in the filter circuit according to the fourth variation, a transmission line 31E is an L-shaped line, and the areas of the electrodes of the first capacitor C1 and the second capacitor C2, that is, the areas of a first electrode 22E and a second electrode (not shown) are increased. In such a case, instead of reducing the inductance of the transmission line 31E, i.e., the inductance of the first inductor L1, the capacitance of the first capacitor C1 is increased. Therefore, even in such a case, the electric signal can be attenuated at a specific frequency (attenuation pole).

As described above, the filter circuit according to the second embodiment is a filter circuit that further includes a second inductor L2 inserted into the signal path (main line 21D) between one electrode of the first capacitor C1 and the first inductor L1. The other element 13 is the second inductor L2. Even in such a case, a small-sized filter circuit can be provided.

As a desirable aspect, the fourth electrode 23D is provided in a direction toward the geometric center of the region 22Da with respect to the geometric center of the first electrode 22D when viewed in the thickness direction of the substrate. Thus, the occurrence of parasitic components between the other element 13 and the fourth electrode 23D can be suppressed.

It should be noted that the embodiments described above are intended to facilitate understanding of the present disclosure, and are not intended to limit the interpretation of the present disclosure. The present disclosure may be changed/improved without necessarily departing from its scope, and the present disclosure also includes equivalents thereof.

The present disclosure may have the following configurations as described above or in lieu of the above.

(1)

A filter circuit including an LC circuit having one end connected to a signal path connecting an input terminal and an output terminal and the other end connected to a reference potential, the filter circuit comprising:

- a substrate;
- a first electrode provided on one main surface of the substrate;
- a second electrode provided inside the substrate; and
- a third electrode provided on the other main surface of the substrate, or inside the substrate on a side opposite to the first electrode with respect to the second electrode, wherein
- the LC circuit includes:
  - a first capacitor having one electrode connected to the signal path;
  - a first inductor having one end connected to the signal path; and
  - a second capacitor having one electrode connected to the first capacitor and the first inductor and the other electrode connected to the reference potential,
- the first electrode and the second electrode overlap with each other at least partially when viewed in a thickness direction of the substrate,
- the second electrode and the third electrode overlap with each other at least partially when viewed in the thickness direction of the substrate,
- a portion of the first electrode overlapping with the second electrode is the one electrode of the first capacitor,
- a portion of the second electrode overlapping with the first electrode is the other electrode of the first capacitor,
- a portion of the second electrode overlapping with the third electrode is the one electrode of the second capacitor, and
- a portion of the third electrode overlapping with the second electrode is the other electrode of the second capacitor.

(2)

The filter circuit according to (1), wherein the electrostatic capacitance of the first capacitor is 0.03 pF or more.

(3)

The filter circuit according to (1) or (2), further comprising:

- a protective film provided on a portion of a surface of the first electrode,
- wherein the first electrode at least partially has a region where the surface of the first electrode is exposed from the protective film.

(4)

The filter circuit according to (3), further comprising:

- a fourth electrode that is an electrode for mounting another element, the fourth electrode being provided apart from the first electrode on the one main surface of the substrate.

(5)

The filter circuit according to (4), further comprising:

- a second inductor inserted into the signal path between the one electrode of the first capacitor and the first inductor,
- wherein the other element is the second inductor.

(6)

The filter circuit of (4) or (5), wherein the fourth electrode is provided in a direction toward the geometric center of the region with respect to the geometric center of the first electrode when viewed in the thickness direction of the substrate.

(7)

The filter circuit according to any one of (4) to (6), wherein the first inductor is a transmission line provided on a main surface of the substrate or inside the substrate and having the one end connected to the signal path and the other end connected to the second electrode,

- a portion of the transmission line overlaps with the fourth electrode in the thickness direction of the substrate, and
- a width of the portion of the transmission line overlapping with the fourth electrode is smaller than a minimum width of the fourth electrode.

(8)

The filter circuit according to any one of (1) to (6), wherein the first inductor is a transmission line provided on a main surface of the substrate or inside the substrate and having the one end connected to the signal path and the other end connected to the second electrode.

(9)

The filter circuit according to (7) or (8), wherein the transmission line has a meander shape when viewed in the thickness direction of the substrate.

(10)

The filter circuit according to any one of (7) to (9), wherein a minimum distance in a width direction between an edge of the transmission line in the width direction and an edge of the second electrode is 20 μm or more.

(11)

The filter circuit according to any one of (1) to (6), wherein the first inductor is an element provided on the one main surface of the substrate.

According to the present disclosure, a filter circuit capable of obtaining desired filter characteristics can be realized.

What is claimed is:

1. A filter circuit comprising:

- an LC circuit having a first end connected to a signal path connecting an input terminal and an output terminal and a second end connected to a reference potential;
- a substrate;
- a first electrode on a first main surface of the substrate;
- a second electrode inside the substrate; and
- a third electrode on a second main surface of the substrate, or inside the substrate on a side opposite to the first electrode with respect to the second electrode,
- wherein the LC circuit comprises:
  - a first capacitor having one electrode connected to the signal path;

a first inductor having a first end connected to the signal path; and a second capacitor having one electrode connected to the first capacitor and to the first inductor, and another electrode connected to the reference potential, wherein the first electrode and the second electrode overlap with each other at least partially in a thickness direction of the substrate, wherein the second electrode and the third electrode overlap with each other at least partially in the thickness direction of the substrate, wherein a portion of the first electrode overlapping with the second electrode is the one electrode of the first capacitor, wherein a portion of the second electrode overlapping with the first electrode is the other electrode of the first capacitor, wherein a portion of the second electrode overlapping with the third electrode is the one electrode of the second capacitor, and wherein a portion of the third electrode overlapping with the second electrode is the other electrode of the second capacitor.

2. The filter circuit according to claim 1, wherein the electrostatic capacitance of the first capacitor is at least 0.03 pF.

3. The filter circuit according to claim 1, further comprising:

a protective film on a portion of a surface of the first electrode, wherein the first electrode comprises a region where the surface of the first electrode is exposed from the protective film.

4. The filter circuit according to claim 3, further comprising:

a fourth electrode that for mounting a first circuit element, the fourth electrode being apart from the first electrode on the first main surface of the substrate.

5. The filter circuit according to claim 4, wherein the first circuit element is a second inductor on the signal path between the one electrode of the first capacitor and the first inductor.

6. The filter circuit of claim 4, wherein the fourth electrode is in a direction toward the geometric center of the region with respect to the geometric center of the first electrode, in the thickness direction of the substrate.

7. The filter circuit according to claim 4, wherein the first inductor is a transmission line on the first or second main surface of the substrate or inside the substrate, and having a second end connected to the second electrode, wherein a portion of the transmission line overlaps with the fourth electrode in the thickness direction of the substrate, and wherein a width of the portion of the transmission line overlapping with the fourth electrode is smaller than a minimum width of the fourth electrode.

8. The filter circuit according to claim 7, wherein the transmission line has a meandering shape in the thickness direction of the substrate.

9. The filter circuit according to claim 7, wherein a minimum distance in a width direction between an edge of the transmission line and an edge of the second electrode is at least 20 μm.

10. The filter circuit according to claim 1, wherein the first inductor is on the first main surface of the substrate.

11. The filter circuit according to claim 1, wherein the first inductor is a transmission line on the first or second main surface of the substrate or inside the substrate, and having a second end connected to the second electrode.

12. The filter circuit according to claim 11, wherein the transmission line has a meandering shape in the thickness direction of the substrate.

13. The filter circuit according to claim 11, wherein a minimum distance in a width direction between an edge of the transmission line and an edge of the second electrode is at least 20 μm.

* * * * *